US010923380B2

(12) United States Patent
Kimball et al.

(10) Patent No.: US 10,923,380 B2
(45) Date of Patent: *Feb. 16, 2021

(54) ELECTROSTATICALLY CLAMPED EDGE RING

(71) Applicant: Lam Research Corporation, Fremont, CA (US)

(72) Inventors: Christopher Kimball, San Jose, CA (US); Keith Gaff, Fremont, CA (US); Feng Wang, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 262 days.

This patent is subject to a terminal disclaimer.

(21) Appl. No.: 15/894,670

(22) Filed: Feb. 12, 2018

(65) Prior Publication Data

US 2018/0166312 A1    Jun. 14, 2018

Related U.S. Application Data

(62) Division of application No. 15/343,010, filed on Nov. 3, 2016, now Pat. No. 9,922,857.

(51) Int. Cl.
| | |
|---|---|
| *H01L 21/683* | (2006.01) |
| *H01L 21/66* | (2006.01) |
| *H01L 21/3065* | (2006.01) |
| *H01J 37/32* | (2006.01) |
| *H01L 21/67* | (2006.01) |

(Continued)

(52) U.S. Cl.
CPC .......... *H01L 21/6833* (2013.01); *H01J 37/00* (2013.01); *H01J 37/32082* (2013.01); *H01J 37/32568* (2013.01); *H01J 37/32642* (2013.01); *H01J 37/32697* (2013.01); *H01J 37/32816* (2013.01); *H01L 21/3065* (2013.01); *H01L 21/67069* (2013.01); *H01L 21/67109* (2013.01); *H01L 21/67126* (2013.01); *H01L 21/67248* (2013.01); *H01L 21/67253* (2013.01); *H01L 21/6831* (2013.01); *H01L 21/68735* (2013.01); *H01L 22/26* (2013.01); *H01J 2237/334* (2013.01); *H01L 21/68785* (2013.01)

(58) Field of Classification Search
None
See application file for complete search history.

(56) References Cited

U.S. PATENT DOCUMENTS

| | | | |
|---|---|---|---|
| 6,394,094 B1 * | 5/2002 | McKenna | ................. A61F 6/08 128/830 |
| 6,475,336 B1 | 11/2002 | Hubacek | |
| 6,557,248 B1 | 5/2003 | Shamouilian et al. | |

(Continued)

FOREIGN PATENT DOCUMENTS

WO    WO 02-31219    4/2002

OTHER PUBLICATIONS

International Search Report from International Application No. PCT/US2017/057450 dated Jan. 26, 2018.

*Primary Examiner* — Angel Roman
(74) *Attorney, Agent, or Firm* — Beyer Law Group LLP

(57) ABSTRACT

An edge ring for use in a plasma processing chamber with a chuck is provided. An edge ring body has a first surface to be placed over and facing the chuck, wherein the first surface forms a ring around an aperture. A first elastomer ring is integrated to the first surface and extending around the aperture.

13 Claims, 6 Drawing Sheets

(51) Int. Cl.
H01L 21/687 (2006.01)
H01J 37/00 (2006.01)

(56) References Cited

U.S. PATENT DOCUMENTS

| | | |
|---|---|---|
| 8,911,589 B2 | 12/2014 | Chang et al. |
| 9,922,857 B1 * | 3/2018 | Kimball ............ H01J 37/32568 |
| 2003/0029610 A1 | 2/2003 | Moslehi |
| 2010/0326957 A1 | 12/2010 | Maeda et al. |
| 2015/0179412 A1 | 6/2015 | Chhatre et al. |
| 2016/0181142 A1 | 6/2016 | Raj et al. |

* cited by examiner

US 10,923,380 B2

ELECTROSTATICALLY CLAMPED EDGE RING

CROSS REFERENCE TO RELATED APPLICATION

This application is a Divisional of U.S. application Ser. No. 15/343,010 filed on Nov. 3, 2016, entitled "ELECTROSTATICALLY CLAMPED EDGE RING", the entire contents of which are incorporated herein by reference thereto.

BACKGROUND

The disclosure relates to a method and apparatus for plasma processing a substrate. More specifically, the disclosure relates to a method and apparatus for clamping an edge ring in a plasma processing chamber.

In plasma processing, a plasma processing chamber with an edge ring may be used to provide improved process control.

SUMMARY

To achieve the foregoing and in accordance with the purpose of the present disclosure, a method for electrostatically clamping an edge ring in a plasma processing chamber with an electrostatic ring clamp with at least one ring backside temperature channel for providing a flow of gas to the edge ring to regulate the temperature is provided. A vacuum is provided to the at least one ring backside temperature channel. Pressure in the at least one ring backside temperature channel is measured. An electrostatic ring clamping voltage is provided when the pressure in the at least one ring backside temperature channel reaches a threshold maximum pressure. The vacuum to the at least one ring backside temperature channel is discontinued. Pressure in the at least one ring backside temperature channel is measured. If pressure in the at least one ring backside temperature channel rises faster than a threshold rate, then sealing failure is indicated. If pressure in the at least one ring backside temperature channel does not rise faster than the threshold rate, a plasma process is continued, using the at least one ring backside temperature channel to regulate a temperature of the edge ring.

In another manifestation, an edge ring for use in a plasma processing chamber with a chuck is provided. An edge ring body has a first surface to be placed over and facing the chuck, wherein the first surface forms a ring around an aperture. A first elastomer ring is integrated to the first surface and extending around the aperture.

These and other features of the present invention will be described in more details below in the detailed description of the invention and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
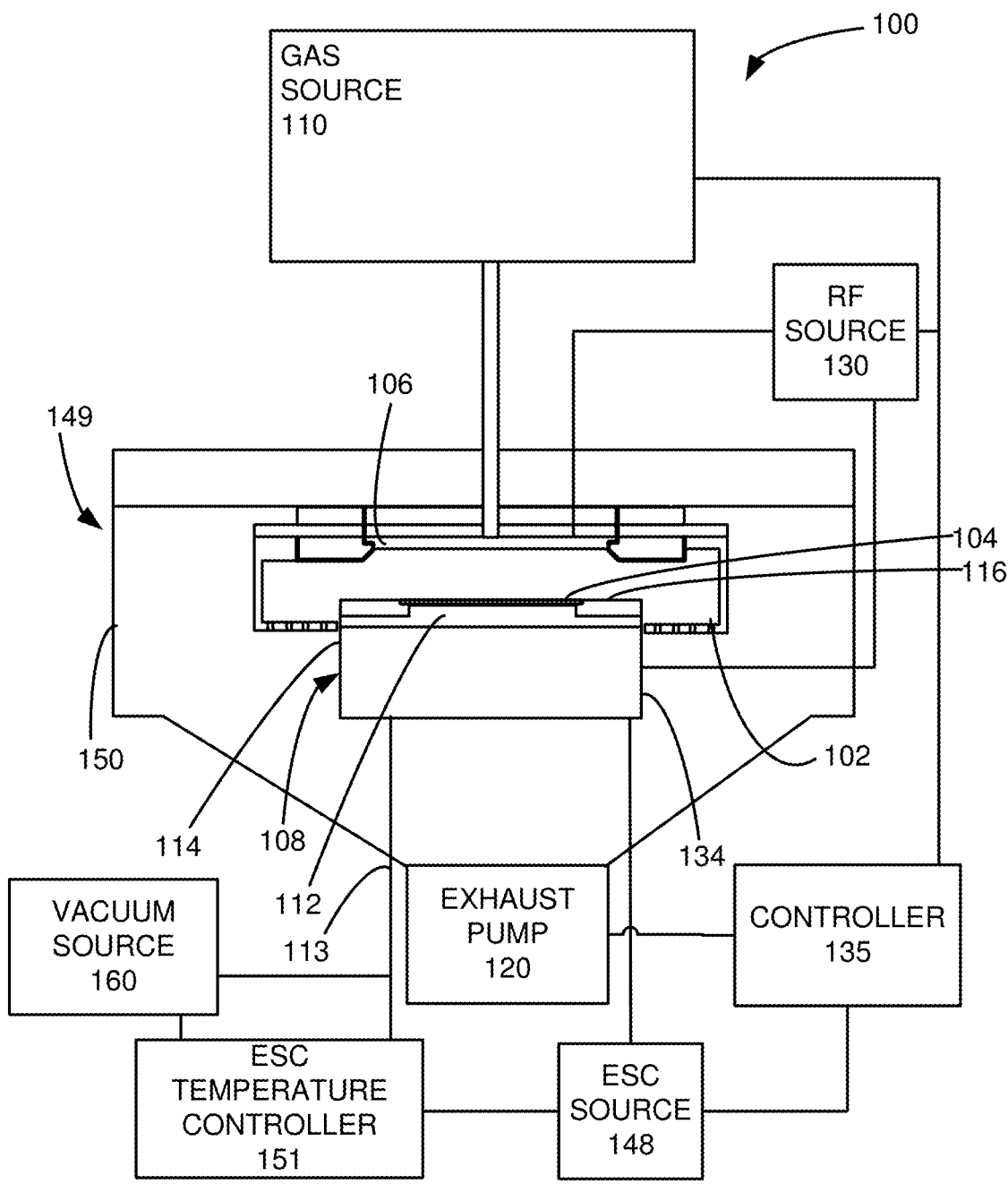
FIG. 1 is a schematic cross-sectional view of a plasma processing chamber with an embodiment.

FIG. 1 is a schematic view of a plasma processing chamber that may be used in an embodiment. In one or more embodiments, the plasma processing system 100 comprises a gas distribution plate 106 providing a gas inlet and an electrostatic chuck system (ESC system) 108 comprising a ceramic plate 112 and a base plate 114, within a processing chamber 149, enclosed by a chamber wall 150. Within the processing chamber 149, a substrate 104 is positioned on top of the ESC system 108. The ESC system 108 may provide a bias from the ESC source 148. A gas source 110 is connected to the plasma processing chamber 149 through the distribution plate 106. An ESC temperature controller 151 is connected to the ESC system 108, and provides temperature control of the ESC system 108. A vacuum source 160 is connected to the ESC system 108. An RF source 130 provides RF power to ESC system 108 and an upper electrode, which in this embodiment is the gas distribution plate 106. In a preferred embodiment, 2 MHz, 60 MHz, and optionally, 27 MHz power sources make up the RF source 130. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments, such as in another embodiment the upper electrodes may be grounded A controller 135 is controllably connected to the RF source 130, the ESC source 148, an exhaust pump 120, and the etch gas source 110. An edge ring 116 is supported by the ESC system 108 at the outer edge of the substrate 104. An example of such a plasma processing chamber is the Exelan Flex™ etch system manufactured by Lam Research Corporation of Fremont, Calif. The process chamber can be a CCP (capacitive coupled plasma) reactor or an ICP (inductive coupled plasma) reactor or may be another type of powered plasma in various embodiments.

Figure 2:
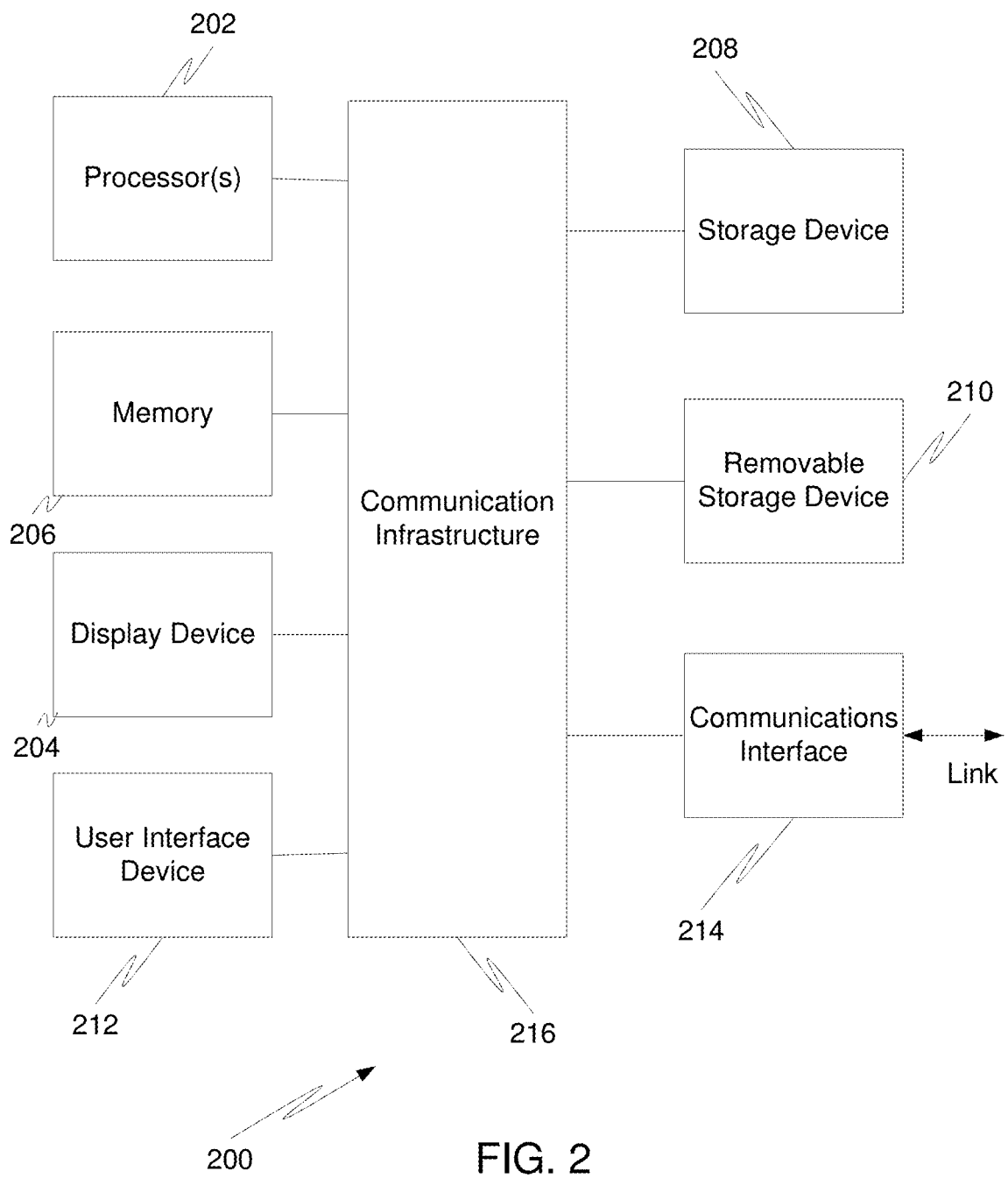
FIG. 2 is a schematic view of a computer system that may be used in practicing an embodiment.

FIG. 2 is a high level block diagram showing a computer system 200, which is suitable for implementing a controller 135 used in embodiments of the present invention. The computer system may have many physical forms ranging from an integrated circuit, a printed circuit board, and a small handheld device, up to a huge super computer. The computer system 200 includes one or more processors 202, and further can include an electronic display device 204 (for displaying graphics, text, and other data), a main memory 206 (e.g., random access memory (RAM)), storage device 208 (e.g., hard disk drive), removable storage device 210 (e.g., optical disk drive), user interface devices 212 (e.g., keyboards, touch screens, keypads, mice or other pointing devices, etc.), and a communication interface 214 (e.g., wireless network interface). The communication interface 214 allows software and data to be transferred between the computer system 200 and external devices via a link. The system may also include a communications infrastructure 216 (e.g., a communications bus, cross-over bar, or network) to which the aforementioned devices/modules are connected.

Information transferred via communications interface 214 may be in the form of signals such as electronic, electromagnetic, optical, or other signals capable of being received by communications interface 214, via a communication link that carries signals and may be implemented using wire or cable, fiber optics, a phone line, a cellular phone link, a radio frequency link, and/or other communication channels. With such a communications interface, it is contemplated that the one or more processors 202 might receive information from a network, or might output information to the network in the course of performing the above-described method steps. Furthermore, method embodiments of the present invention may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory, and shall not be construed to cover transitory subject matter, such as carrier waves or signals. Examples of computer code include machine code, such as one produced by a compiler, and files containing higher level code that are executed by a computer using an interpreter. Computer readable media may also be computer code transmitted by a computer data signal embodied in a carrier wave and representing a sequence of instructions that are executable by a processor.

Figure 3:
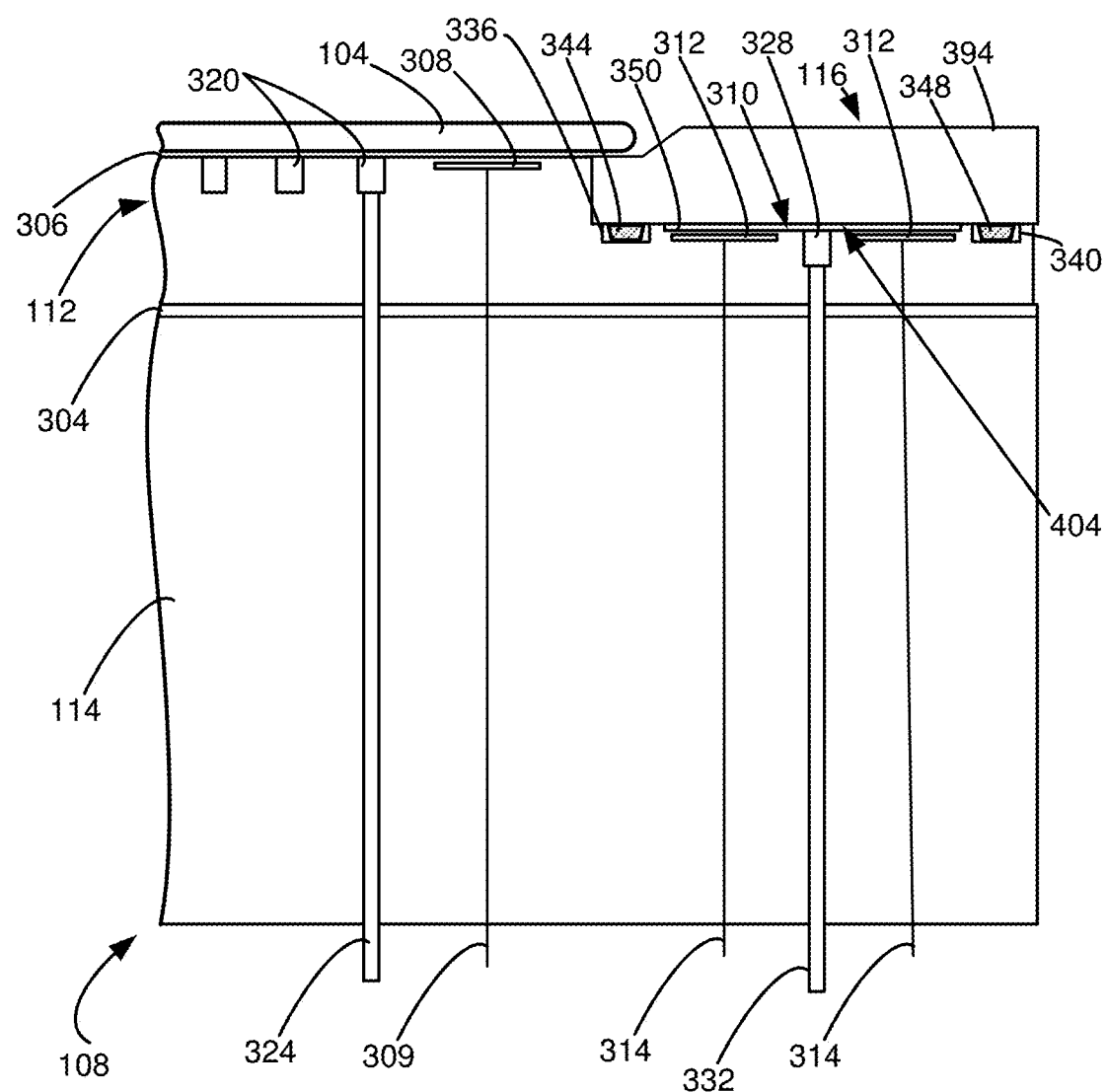
FIG. 3 is an enlarged view of the etch ring and electrostatic ring chuck, shown in FIG. 1.

FIG. 3 is an enlarged view of part of the ESC system 108 and substrate 104. The ESC system 108 comprises a ceramic plate 112 and a base plate 114. An elastomer bond 304 holds the ceramic plate 112 to the base plate 114. In a raised central portion 306 of the ceramic plate 112 are substrate clamping electrodes 308, which are used to apply a voltage to electrostatically chuck the substrate 104. At least one substrate chucking clamping electrode lead 309 is connected between the substrate clamping electrodes 308 and the ESC source 148, shown in FIG. 1. In a lower peripheral portion 310 of the ceramic plate are edge ring clamping electrodes 312, which are used to apply a voltage to electrostatically chuck the edge ring 116. At least one edge ring clamping electrode lead 314 is connected between the edge ring clamping electrodes 312 and the ESC source 148, shown in FIG. 1. In one embodiment, the ESC source 148 may be a plurality of voltage sources. In another embodiment, the ESC source 148 may be a single voltage source with a plurality of switches to independently apply different voltages to the substrate clamping electrodes 308 and the edge ring clamping electrodes 312. A portion of the lower peripheral portion 310 may be recessed to form a gap formed by a cooling groove 350 between the lower peripheral portion 310 and the edge ring 116. The cooling groove 350 provides a region, which allows the coolant to flow near the backside of the edge ring 116, and facilitate creating a seal for the coolant.

In the raised central portion 306 is a plurality of substrate backside temperature channels 320, which are connected through a fluid connection 324 to the ESC temperature controller 151, shown in FIG. 1. In the lower peripheral portion 310 are a plurality of ring backside temperature channels 328, which are connected through a fluid connection 332 to the ESC temperature controller 151, shown in FIG. 1. A first sealing groove 336 in the upper surface of the lower peripheral portion 310 makes a ring around the raised central portion 306. A second sealing groove 340 in the upper surface of the lower peripheral portion 310 makes a ring around and is concentric with the first sealing groove 336.

Figure 4:
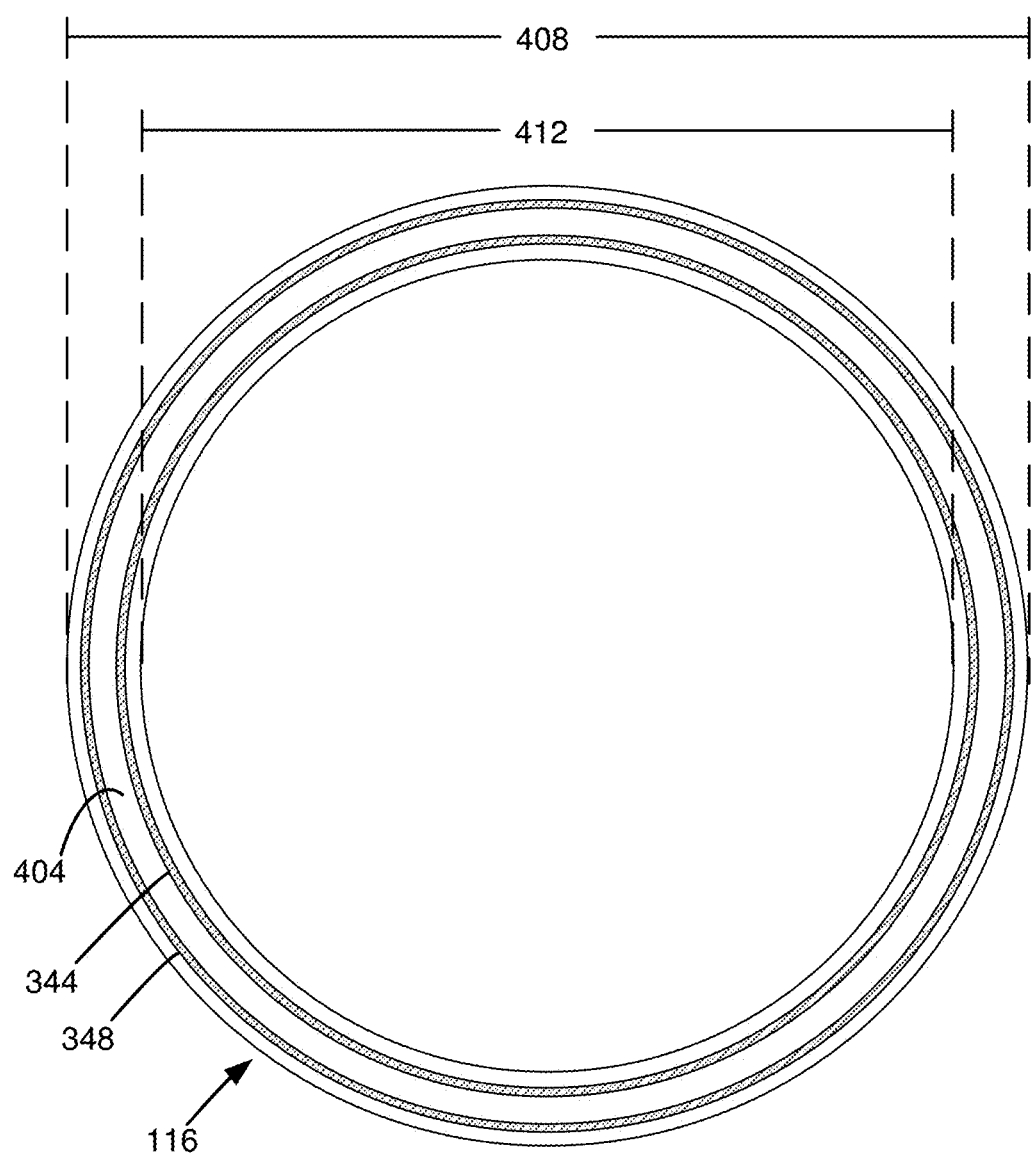
FIG. 4 is a bottom view of an edge ring of an embodiment.

The edge ring 116 comprises an edge ring body 394 and a first elastomer ring 344 integrated to the edge ring body 394 and a second elastomer ring 348 integrated to the edge ring body 394. FIG. 4 is a bottom view of the edge ring 116. The bottom of the edge ring 116 forms a first surface 404, which is also shown in FIG. 3. The edge ring 116 has an outer diameter 408 and an inner diameter 412. In this example, the outer diameter is 400 mm and the inner diameter is 290 mm. Within the inner diameter is a central aperture of the edge ring 116. In this example, the edge ring 116 is formed from silicon, so that the edge ring 116, including the first surface 404, is conductive. In this example, the first elastomer ring 344, and the second elastomer ring 348, and the edge ring 116 are all concentric, as shown. The hole in the center of the edge ring 116 forms a central aperture, as shown.

The edge ring clamping electrodes 312 form an electrostatic ring chuck. The substrate clamping electrodes 308 form an electrostatic wafer chuck. If the entire edge ring 116 or first surface 404 is not conductive, then the edge ring 116 would need to have conductive portions. As shown in FIG. 3, when the edge ring 116 is mounted on the electrostatic ring chuck, so that conductive portions of the edge ring 116 are over the edge ring clamping electrodes 312 and the raised central portion 306 passes through the central aperture, the first elastomer ring 344 is placed in the first sealing groove 336 and the second elastomer ring 348 is placed in the second sealing groove 340.

In this example, the first sealing groove 336 and the second sealing groove 340 have a depth of 0.5 mm. The first elastomer ring 344 and the second elastomer ring 348 have a height of 0.5 mm after clamping.

Figure 5:
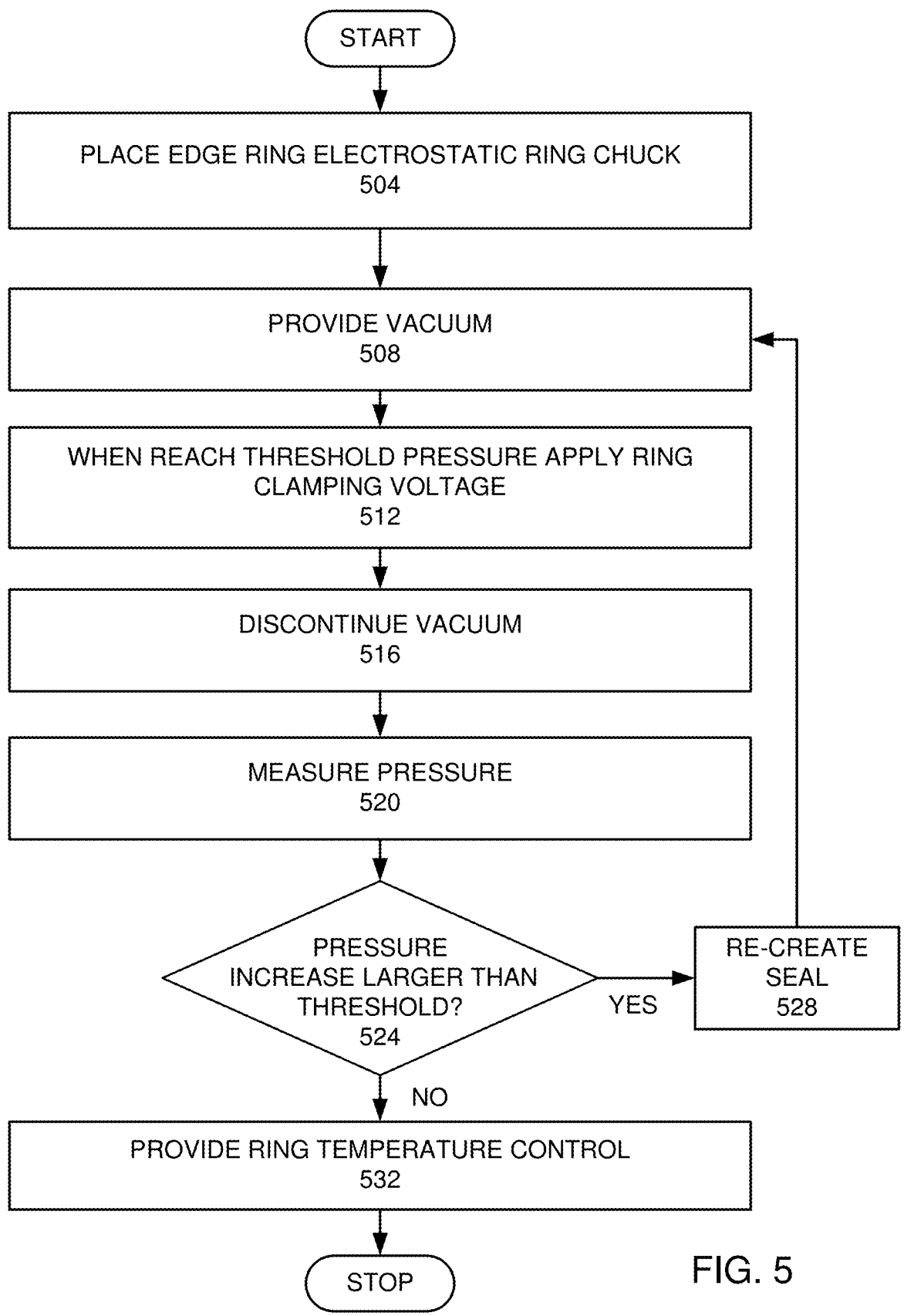
FIG. 5 is a flow chart of an embodiment.

FIG. 5 is a high level flow chart of a process for chucking the edge ring 116. The edge ring 116 is placed on the electrostatic ring chuck (step 504). The edge ring 116 may be placed on the electrostatic ring chuck, as shown in FIG. 1 and FIG. 3. The electrostatic ring chuck is formed by the edge ring clamping electrodes 312. The lower peripheral portion 310 of the ceramic plate 112, the first sealing groove 336 in the upper surface of the lower peripheral portion 310, the second sealing groove 340 in the upper surface of the lower peripheral portion 310, the cooling groove 350, and the plurality of ring backside temperature channels 328 may further make up the electrostatic ring chuck. A vacuum is provided to the plurality of ring backside temperature channels 328 by connecting the fluid connection 332 to vacuum source 160 (step 508). The vacuum source 160 provides a vacuum, which causes the edge ring 116 to move towards the upper surface of the lower peripheral portion 310, which causes the first elastomer ring 344 and the second elastomer ring 348 to be compressed within the first sealing groove 336 and the second sealing groove 340, respectively. Preferably, the chamber pressure is atmospheric pressure, so that the pressure on top of the edge ring 116 is atmospheric pressure. The applied vacuum causes mechanical movement of the edge ring 116 to facilitate electrostatic clamping of the edge ring 116 and allows for testing of the seal. The pressure in the backside temperature channels is measured. When the pressure is lowered to a threshold pressure, a ring clamping voltage is applied (step 512). The pressure threshold indicates that the edge ring 116 has been forced to a threshold distance, which will allow the edge ring clamping electrodes 312 to clamp the edge ring 116. The application of the vacuum is then discontinued (step 516). Pressure in the backside temperature channels 328 is measured (step 520). If the measured pressure increase is larger than a threshold rate, it indicates that the seal has failed (step 524). Then the seal must be re-created (step 528). This may be done by re-seating the edge ring. This may require replacing the edge ring 116 so that the first elastomer ring 344 and the second elastomer ring 348 are replaced. If the measured pressure increase is smaller than the threshold rate, it indicates that the seal is sufficient. The backside temperature channels 328 are then used for temperature control of the edge ring 116 (step 532). The edge ring clamping electrodes continuously clamp the edge ring during the placement of a substrate over the substrate clamping electrodes of the ESC system, and during the clamping of the substrate, the processing of the substrate, the declamping of the substrate, and the removal of the substrate. Therefore, the ring clamping electrodes and the substrate clamping electrodes are operated independently, allowing the ring clamping electrodes to continuously clamp, while the substrate clamping electrodes are used to clamp and subsequently declamp the substrate.

This embodiment provides an edge ring seal, which allows for temperature control of the edge ring. Allowing temperature control of the edge ring provides greater control during plasma processing, which improves the plasma processing.

This embodiment provides various advantages over a configuration that uses O-rings. In order to use an O-ring for the similar purposes, the O-ring would need to be thin with a large diameter and be made of a soft material. The placement of such an O-ring to create the desired seal will require a highly skilled technician, due to the fragility of the O-ring and the various requirements to create the seal, such as preventing pinching or bunching of the O-ring. This embodiment allows a less skilled technician to simply and easily place the edge ring on the electrostatic ring chuck.

In other embodiments, the ceramic plate may be in two parts, with the raised central portion 306 being separate from the lower peripheral portion 310. The entire edge ring may be made of a conductive material, such as silicon. In other embodiments, the edge ring is a dielectric material with conductive parts, which would be placed over the ring clamping electrodes when the edge ring is placed on the electrostatic ring chuck. The conductive parts facilitate electrostatic clamping. Preferably, the edge ring is at least one of silicon, silicon carbide, or quartz.

In various embodiments, the height of each elastomer ring is greater than the depth of the groove in which the elastomer ring is placed. This causes the elastomer ring to be compressed when creating the seal, which helps to establish the seal. In various embodiments, the elastomer may have different cross-sections. Preferably, the cross-section of the elastomer ring is at least one of rectangular, square, triangular, trapezoidal, or semicircular. More preferably, the bottom of the cross-section of the elastomer ring is narrower than the top of the elastomer ring, which is integrated with the rest of the edge ring. Most preferably, the elastomer ring is trapezoidal, as shown in FIG. 3. Preferably, the elastomer ring has a height between 0.25 mm to 2 mm. Preferably, the height of the elastomer ring is between 10 to 50 microns greater than the depth of the groove. Preferably, the tolerance of the height of the elastomer ring is 50 microns or better. More preferably, the tolerance of the height elastomer ring is 12-13 microns. Preferably, the outer diameter of the edge ring is between 200 mm to 450 mm. More preferably, the outer diameter of the edge ring is between 300 mm to 400 mm. Preferably, the edge ring, the first elastomer ring, and the second elastomer ring are concentric. Preferably, the first elastomer ring is within 10 mm of the inner edge of the edge ring and the second elastomer ring is within 30 mm of the outer edge of the edge ring.

In chucking a wafer, an elastomer ring is not needed, since a wafer will bend to help create a seal. Since edge rings are much thicker than a wafer, the edge ring does not sufficiently bend to create a seal without elastomer rings. In some embodiments, the elastomer ring may be formed by applying a wet or liquid elastomer on the edge ring, and then drying or solidifying and curing the elastomer on the edge ring. In various embodiments, the elastomer ring is made of a soft elastomer that will not outgas beyond a specific limit, such as silicone. Preferably, an elastomer ring comprises silicone with a ring diameter of at least 200 mm and a height between 0.25 mm to 2 mm. Preferably, the thickness of a cross-section of the elastomer is less than 3 mm. Preferably, an elastomer ring comprises silicone with a diameter of at least 200 mm and a height between 0.25 mm to 1.5 mm. The grooves in the surface of the ceramic plate allow the surface of the edge ring to be placed close to the electrostatic ring clamps to allow clamping. The height of the elastomer ring and depth of the groove with some compression of the elastomer ring provides a gas seal around the circumferences of the elastomer rings and while compensating for 20 microns of nonflatness of the edge ring, which requires an additional 20 microns of elastomer compression (elastomer compression is height of elastomer seal minus the groove depth). An optional feature in the surface of the ceramic plate provides a 10 micron gap between the surface of the ceramic plate and the edge ring. The gap 350 can range from 0 microns to 20 microns.

In an embodiment, the height of the elastomer is equal to the depth of the groove plus the tolerance of the groove depth plus the tolerance of the elastomer seal height (all assuming symmetric tolerances) plus the flatness of the edge ring. So if the groove depth is 0.5 mm±25 um, the elastomer seal can be controlled to within ±15 um of target height, and the flatness of the ring is 20 um, then the elastomer seal target height should be 0.5 mm+25 um+15 um+20 um=0.56 mm. This ensures that when the elastomer is at its smallest height, and groove is at its largest depth, and flatness at its worst, the seal will still make contact with the ring surface at the bottom of the groove. Since having all items at worst case simultaneously is unlikely, we sometime use RSS addition, in which case elastomer seal target height should be 0.5 mm+square root $(25\ um^2+15\ um^2+20\ um^2)$=0.535 mm.

In an embodiment, the edge ring has a thickness of at least 1 mm in order to tolerate wear during plasma processing and to provide flexibility in height. In some embodiments, the edge ring has an upper surface that is above the upper surface of the wafer to provide sheath control.

Preferably, the backside temperature control channels are helium channels that carry helium gas coolant. The coolant is used to cool both the substrate and the edge rings. Such an embodiment allows for temperature control of both the substrate and edge ring. In addition, the embodiment allows for separate temperature control of the substrate and edge ring. In other embodiments, other gases or liquids may be used as a coolant, such as argon, air, nitrogen, or a liquid with a very low vapor pressure.

Figure 6:
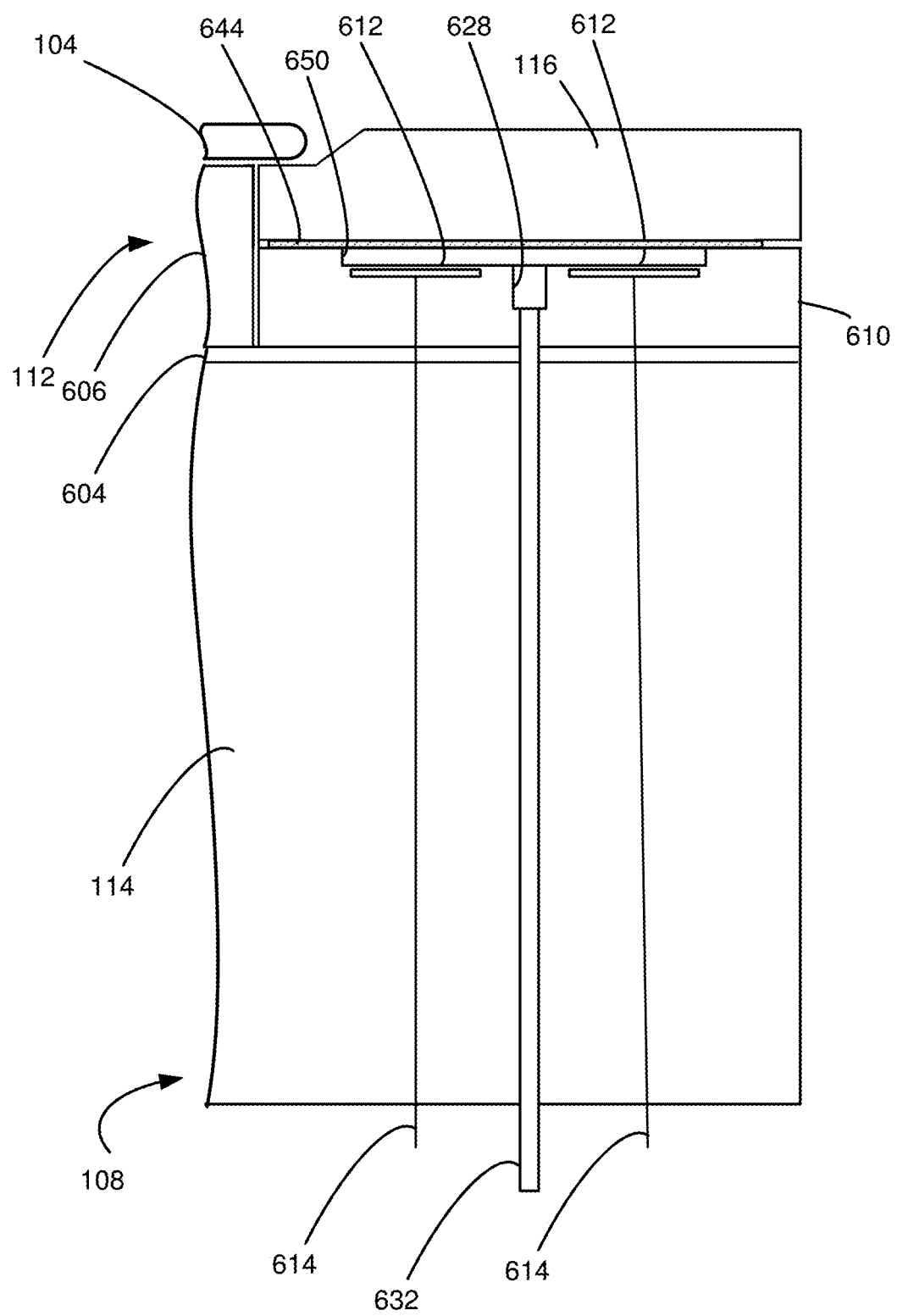
FIG. 6 is an enlarged view of part of the ESC system in another embodiment.

FIG. 6 is an enlarged view of part of the ESC system 108 and substrate 104 in another embodiment. The ESC system 108 comprises a ceramic plate 112 and a base plate 114. An elastomer bond 604 holds the ceramic plate 112 to the base plate 114. In this embodiment, the ceramic plate 112 comprises a central substrate support section 606 and a peripheral ring shape edge ring support section 610. In the edge ring support section 610 of the ceramic plate 112 is a circular cooling groove 650, which surrounds the substrate support section 606 and central aperture of the edge ring support section 610. Under the bottom of the cooling groove 650 are edge ring clamping electrodes 612, which are used to apply a voltage to electrostatically chuck the edge ring 116. At least one edge ring clamping electrode lead 614 is connected between the edge ring clamping electrodes 612 and the ESC source 148, shown in FIG. 1. The cooling groove 650 causes a gap to be between the edge ring support section 610 and the edge ring 116, when the edge ring 116 is placed on the edge ring support section 610.

In the edge ring support section 610 are a plurality of ring backside temperature channels 628, which are connected through a fluid connection 632 to the ESC temperature controller 151, shown in FIG. 1 and to the cooling groove 650. The edge ring 116 has an elastomer ring 644 integrated to the edge ring 116. In this example, the elastomer ring 644 is in the shape of a sheet forming a ring. Preferably, the sheet is no more than 25 microns thick and a width that is greater than the width of the cooling groove 650.

The edge ring clamping electrodes 612, the cooling groove 650, and the edge ring support section 610 form an electrostatic ring chuck. As shown in FIG. 6, when the edge ring 116 is mounted on the electrostatic ring chuck, so that conductive portions of the edge ring 116 are over the edge ring clamping electrodes 612 and the central substrate support section 606 passes through the central aperture, the elastomer ring 644 and the elastomer ring 644 extends across the cooling groove 650, as shown.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. An edge ring for use in a plasma processing chamber with a chuck, comprising:
    an edge ring body with a first surface to be placed over and facing the chuck, wherein the first surface forms a ring around an aperture; and
    a first elastomer ring integrated to the first surface and extending around the aperture.

2. The edge ring, as recited in claim 1, further comprising a second elastomeric ring integrated to the first surface and extending around the aperture.

3. The edge ring, as recited in claim 2, wherein the first elastomeric ring is concentric with the second elastomeric ring.

4. The edge ring, as recited in claim 2, wherein the edge ring body, first elastomer ring and second elastomer ring are all concentric.

5. The edge ring, as recited in claim 4, wherein the edge ring body has an outer diameter between 200 mm to 400 mm.

6. The edge ring, as recited in claim 5, wherein the first surface of the edge ring body has an inner edge and an outer edge, wherein the first elastomer ring is within a distance of 10 mm from the inner edge of the first surface and the second elastomer ring is within a distance of 30 mm from the outer edge of the first surface.

7. The edge ring, as recited in claim 1, wherein the first elastomer ring has a height of between 0.25 mm and 2 mm.

8. The edge ring, as recited in claim 1, wherein a tolerance of the height of the first elastomer ring is 50 microns or better.

9. The edge ring, as recited in claim 1, wherein the first elastomer ring is formed from a material comprising silicone.

10. The edge ring, as recited in claim 1, wherein the first elastomer ring has a cross-section in the shape of a trapezoid, square, rectangle, triangle, or semicircle.

11. The edge ring, as recited in claim 1, wherein the edge ring body has an outer diameter between 200 mm to 400 mm.

12. The edge ring, as recited in claim 1, wherein the edge ring body comprises at least one of silicon, silicon carbide, or quartz.

13. The edge ring, as recited in claim 1, wherein the first elastomer ring is applied to the first surface as a liquid elastomer.

* * * * *